United States Patent [19]

Minnema et al.

[11] Patent Number: 4,481,340

[45] Date of Patent: Nov. 6, 1984

[54] PHOTOSENSITIVE POLYAMIC ACID DERIVATIVE, COMPOUND USED IN MANUFACTURE OF DERIVATIVE, METHOD OF MANUFACTURING SUBSTRATE HAVING POLYIMIDE LAYER, AND SEMICONDUCTOR DEVICE MADE FROM SAID METHOD

[76] Inventors: Lourens Minnema; Johan M. van der Zande, both of Groenewoudseweg 1, Eindhoven, Netherlands

[21] Appl. No.: 460,415

[22] Filed: Jan. 24, 1983

[30] Foreign Application Priority Data

Dec. 3, 1982 [NL] Netherlands ................. 8204688

[51] Int. Cl.[3] .................. G03C 1/70; C08G 69/48
[52] U.S. Cl. .................. 525/426; 204/159.19; 430/283; 430/287
[58] Field of Search .............. 525/928, 426, 420; 430/283, 287; 204/159.19

[56] References Cited

U.S. PATENT DOCUMENTS 4,107,174  8/1978  Baumann et al. .......... 260/326 NS
4,243,743  1/1981  Hiramoto et al. ................ 430/281
4,331,705  5/1982  Samudrala .................. 204/159.19

Primary Examiner—John E. Kittle
Assistant Examiner—Cynthia Hamilton
Attorney, Agent, or Firm—Norman N. Spain

[57] ABSTRACT

A photosensitive polyamic acid derivative obtained by treating polyamic acid with a compound of the formula (1), compound of formula (1), method of manufacturing a substrate having a polyimide layer by providing the substrate with a layer of the photosensitive polyamic acid derivative and then exposing, developing and imidizing the layer, as well as a semiconductor device comprising a polyimide layer obtained by using the above-mentioned method.

2 Claims, No Drawings

PHOTOSENSITIVE POLYAMIC ACID DERIVATIVE, COMPOUND USED IN MANUFACTURE OF DERIVATIVE, METHOD OF MANUFACTURING SUBSTRATE HAVING POLYIMIDE LAYER, AND SEMICONDUCTOR DEVICE MADE FROM SAID METHOD

The invention relates to a photosensitive polyamic acid derivative.

Such a derivative is known inter alia from German Offenlegungsschrift No. 29.14.619. In said Offenlegungsschrift amino acrylic esters or amino-methacrylic esters of a polyamic acid are disclosed which are obtained by treating a polyamic acid with amino acrylates or amino methacrylates. By exposing the photosensitive polyamic acid derivatives to light, the derivative is cross-linked in the exposed places and consequently becomes insoluble. The known photosensitive polyamic acid derivatives have the disadvantage that the cross linking (polymerisation) reaction proceeds comparatively slowly.

It is the object of the present invention to provide a photosensitive polyamic acid derivative which, upon exposure to light, cross-links very rapidly to form an insoluble product. The velocity is at least a factor 10 higher than that of the above-described known derivates. Another object according to the invention is to provide a photosensitive polyamic acid derivative which is optimally compatible with and chemically closely related to polyamic acids.

According to the invention these objects are achieved with a photosensitive polyamic acid derivative obtained by treating a polyamic acid with a compound of the formula

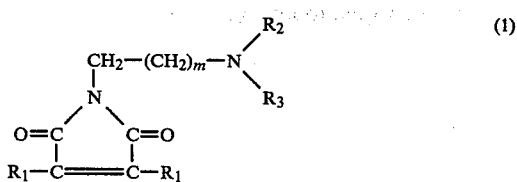

wherein $R_2$ and $R_3$ are equal or different and represent a hydrogen atom or an alkyl group having 1-4 carbon atoms, $R_1$ is an alkyl group having 1-4 carbon atoms and m has the value 0-3.

The reaction preferably is carried out in the presence of a solvent and at room temperature. Examples of suitable solvents are N-methyl-2-pyrrolidone or dimethyl acetamide.

The quantity of added compound of formula 1 is not restricted to narrow limits. The quantity may be, for example, from 20-200% of the stoichiometric (equivalent) quantity.

The starting product, the polyamic acid, is a known commercially available substance. The polyamic acid may be represented by the formula

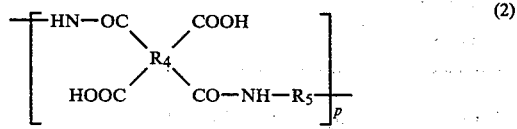

wherein $R_5$ is a bivalent organic radical selected from the group consisting of:

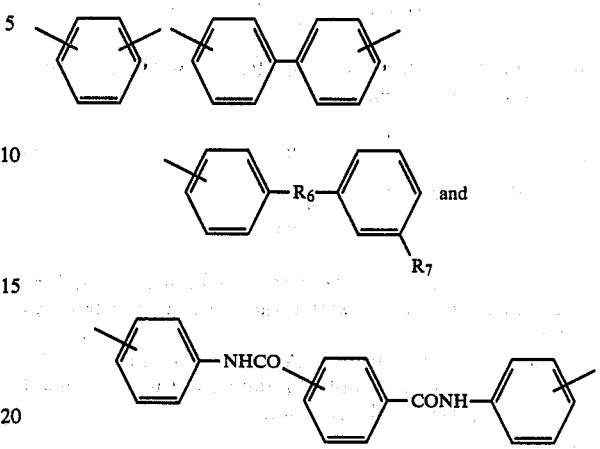

wherein $R_6$ is a bivalent organic radical selected from the group consisting of: $-(CH_2)_m-$, wherein $m=1-4$, $-CO-$, $-O-$, $-SO-$, $-SO_2-$ and $-CONH-$, and $R_7$ is a hydrogen atom or a $-CONH_2$ group, $R_4$ is a tetravalent organic radical selected from the group consisting of:

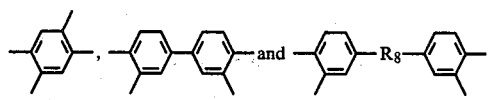

wherein $R_8$ is a bivalent organic radical selected from the group consisting of: $-(CH_2)_q-$, wherein $q=1-4$ $-CO-$, $-O-$, $-SO-$, and $-SO_2-$ and p is at least equal to 15.

The polyamic acid according to formula (2) is of any conventional type. In this respect reference may be made to U.S. Pat. No. 3,943,065. The polyamic acid is prepared by reacting an organic dianhydride of formula:

with an equivalent quantity of an organic diamine of the formula:

$$H_2N-R_5-NH_2 \quad (4)$$

wherein $R_4$ and $R_5$ have the above meanings.

Preferably a polyamic acid is used which obtained by reacting pyromellitic acid dianhydride or in particular 3,3′, 4,4′-benzophenone tetracarboxylic acid dianhydride with an equivalent quantity of 4,4′ diaminodiphenyl ether or 4,4′ diaminodiphenyl ether-3-carbonamide.

The above compound of the formula (1) is a novel substance. The invention also relates to this novel substance. The compound of formula (1) is prepared by reacting an anhydride of formula

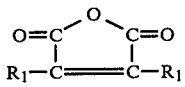

wherein R₁ has the above-mentioned meaning, with a compound of formula

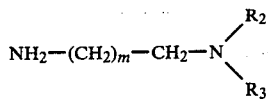

wherein $R_2, R_3$ and m have the above meanings. The reaction is preferably carried out in the presence of an inert solvent.

In the reaction of the compound of formula 1 with the polyamic acid, a soluble ammonium salt is formed which is shown by the formula

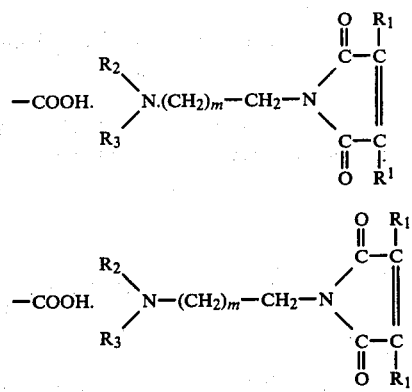

The vertical zig-zag line in this formula represents the polyamic acid molecule of which, for clarity, only two of the many COOH-groups are shown. The COOH-groups are thus linked to the groups

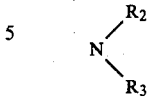

of the compound of formula 1 via the ammonium salt. The symbols $R_1$, $R_2, R_3$ and m have the above meanings.

In a preferred form of the invention the photosensitive polyamic acid derivative is a derivative obtained by treating polyamic acid with a compound of the formula

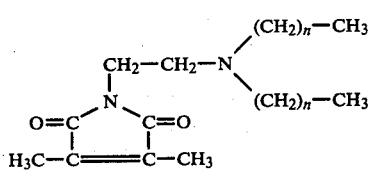

wherein n has the value 0 or 1.

The compound of formula 8 per se forms part of the present invention.

The invention furthermore relates to a method of manufacturing a substrate comprising a polyimide layer which is provided in the form of a pattern, characterized in that the substrate is provided with a layer of the photosensitive polyamic acid as claimed in claim 1 or 2, the said layer is exposed to light in the form of a pattern and developed and the layer is then subjected to a temperature treatment in which the exposed polyamic acid derivative is converted into polyimide.

Upon exposing the photosensitive polyamic acid, a cross-linking occurs in the form of a cyclo-addition according to the following scheme:

(9)

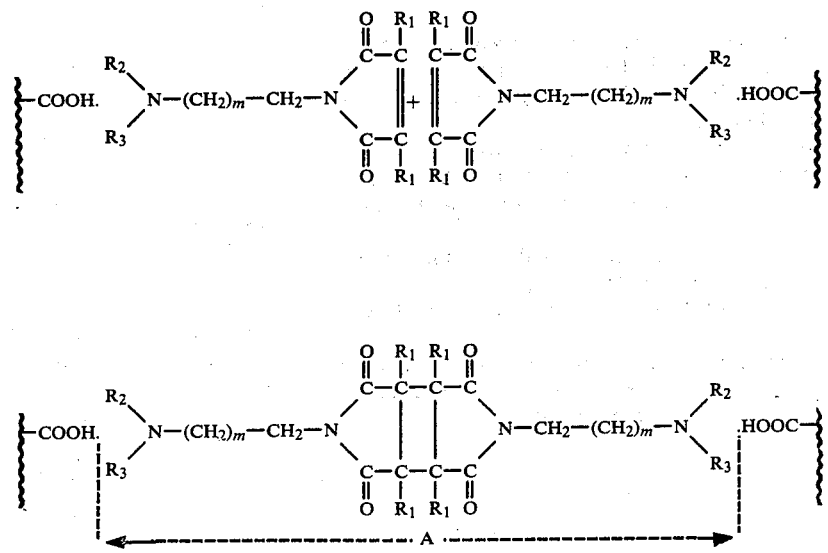

The cross-linking under the influence of light takes place in the presence of a photo-initiator. Photo-initiators are well known from literature, for example from "Light-sensitive systems" by J. Kosar, John Wiley & Sons, New York, pp. 143-146 and 160-188. Quite suitable photoinitiators are thioxanthon, thioxanthon-carboxylic acid and esters, thioesters and amides of thioxanthoncarboxylic acid. The photo-initiator may be added to the polyamic acid solution. The quantity of photo-initiator is from 0.01 to 10% by weight and in particular from 0.3 to 5% by weight.

The compound of formula 9 is insoluble. In the development step following the exposure, the nonexposed polyamic acid derivative dissolves so that a pattern of exposed polyamic acid derivative is obtained. Imidisation of the polyamic acid derivative takes place by a thermal treatment at a temperature of approximately 250°-450° C. The bridge portion A of the product shown in formula 9 is decomposed and evaporated by this treatment.

The photosensitive polyamic acid derivative according to the invention may be used on all kinds of substrates and, after exposure, development and imidisation may form a pattern-shaped coating layer, orientation layer (in displays), resistance layer, passivating layer, and the like of the polyimide.

The photosensitive polyamic acid derivative may advantageously be used in electrical components, in particular semiconductor devices having a semiconductor body comprising at least one semiconductor circuit element, for example, integrated circuits, sometimes termed ICs or chips.

The invention will now be described in greater detail with reference to the following example.

(a) Preparation of polyamic acid 10.0 g (50 m.mol) of 4,4'-diaminodiphenyl ether and 160 g of dry, freshly distilled dimethylacetamide are provided in a dry 500 ml flask comprising a stirrer, a tube filled with calcium chloride, and a sluice system suitable for the addition of solid material under an inert atmosphere. The contents of the flask are kept under nitrogen during the preparation. By means of the sluice system 16.1 g (50 m.mol) of benzophenonetetracarboxylic acid dianhydride are added to the vigorously stirred solution. Stirring is continued until the reaction is completed.

(b) Preparation of N-(dimethylaminoethyl)2,3-dimethylmaleimide

A solution of 17.5 g (0.2 mol.) of asym.dimethyl ethylene diamine in 100 ml of methanol is added dropwise to a solution of 25.1 g (0.2 mol.) of 2,3-dimethyl maleic acid anhydride in 100 ml of chloroform. The mixture is stirred for one hour at 15° C. The solvents are evaporated in vacuo and the residue is recrystallised from acetone. The pure product has a melting point of 9° C. and is used in the next step (c).

(c) Preparation of photosensitive polyamic acid derivative

In a 500 ml flask, 19,6 g (0,1 mol.) of the N-(dimethylaminoethyl) 2,3-dimethylmaleimide are added to 26.1 g of the polyamic acid in 160 g of dimethylacetamide in (a) and stirred. 5% by weight of thioxanthone are then added to the solution. By spinning a part of this solution on a silicon wafer, a film is obtained which, after heating at 400° C., is approximately 2 μm thick. Drying takes place at 80° for one hour. The wafer is then exposed through a mask having linear apertures to the light of a Philips SP-500 Watt high pressure mercury lamp for one second. After developing in a liquid mixture of dimethyl acetamide and methanol (2:1) a pattern having sharp edges is obtained. The developed film is then heated at 150° C. for one hour and at 400° C. for one hour. The sharp boundaries of the pattern are maintained.

What is claimed is:

1. A photosensitive polyamic acid derivative obtained by treating a polyamic acid with a compound of the formula

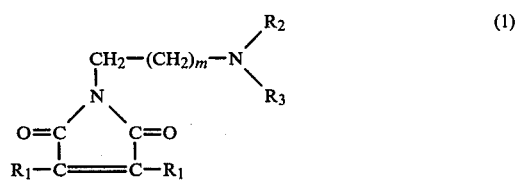

wherein $R_2$ and $R_3$ are equal or different and represent a hydrogen atom or an alkyl group having 1-4 carbon atoms, $R_1$ is an alkyl group having 1-4 carbon atoms, and m has the value 0-3.

2. A photosensitive polyamic acid derivative obtained by treating polyamic acid with a compound of the formula

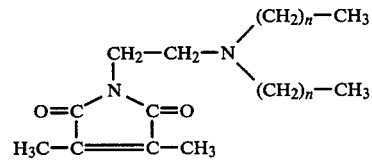

wherein n has the value 0 or 1.

* * * * *